United States Patent
Markozen et al.

(10) Patent No.: US 7,868,664 B2
(45) Date of Patent: Jan. 11, 2011

(54) GENERATING A TRIGGER FROM A DIFFERENTIAL SIGNAL

(75) Inventors: Gene L. Markozen, Tigard, OR (US); Barton T. Hickman, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 31 days.

(21) Appl. No.: 12/355,641

(22) Filed: Jan. 16, 2009

(65) Prior Publication Data

US 2010/0182050 A1    Jul. 22, 2010

(51) Int. Cl.
*H03K 5/22* (2006.01)
(52) U.S. Cl. ....................................................... 327/65
(58) Field of Classification Search .................. 327/63, 327/65, 68
See application file for complete search history.

(56) References Cited

U.S. PATENT DOCUMENTS

| | | | | |
|---|---|---|---|---|
| 6,650,149 B1 * | 11/2003 | Wong | ........................... | 327/65 |
| 7,397,269 B2 * | 7/2008 | Ishibashi et al. | .............. | 326/14 |
| 7,424,650 B1 * | 9/2008 | Sivadasan et al. | ........... | 714/700 |
| 2008/0030242 A1 * | 2/2008 | Chujo et al. | ................. | 327/109 |

FOREIGN PATENT DOCUMENTS

| DE | 19912632 A1 | 9/2000 |
|---|---|---|
| SU | 785982 A1 | 12/1980 |

OTHER PUBLICATIONS

2005, Analog Devices, Inc., Ultrafast 3.3 V/5 V Single-Supply SiGe Comparators, ADCMP572/ADCMP573. htt://www.analog.com/static/imported-files/data_sheets/ADCMP572_573.pdf.
2003-2008, Inphi Corporation. 25706CP, 25 GHz Latched Comparator. http://www.inphi-corp.com/product-overview/analog-mixed-signal/latched-comparator/25706cp.php.
2005, Analog Devices, Inc., 1.5 GHz Ultrahigh Speed OpAmp AD8000. http://www.analog.com/static/imported-files/data_sheets/AD8000.pdf.

* cited by examiner

*Primary Examiner*—Jeffrey S Zweizig
(74) *Attorney, Agent, or Firm*—Michael A. Nelson

(57) ABSTRACT

A trigger circuit generates a trigger signal when a differential input signal crosses a differential threshold voltage level. A first side of the differential input signal is applied to a first terminal of a first load termination resistor. A second side of the differential signal is applied to a first terminal of a second load termination resistor. A first side of the differential threshold voltage level is applied to a second terminal of the first load termination resistor. A second side of the differential threshold voltage level is applied to a second terminal of the second load termination resistor. A comparator generates the trigger signal when a voltage level at the first terminal of the first resistor exceeds a voltage level at the first terminal of the second resistor.

4 Claims, 1 Drawing Sheet

GENERATING A TRIGGER FROM A DIFFERENTIAL SIGNAL

FIELD OF THE INVENTION

The present invention relates to triggers for test and measurement instruments, and more particularly to triggers for differential signals.

BACKGROUND OF THE INVENTION

Oscilloscopes such as the DPO/DSA70000 Series Oscilloscopes available from Tektronix, Inc. of Beaverton, Oreg. use trigger circuits to provide stable waveforms for display, quickly capture abnormal behavior, etc. One type of trigger circuit is an "edge trigger" which triggers the oscilloscope when an input signal crosses a user-specified threshold voltage level in a user-specified direction. An edge trigger is typically implemented with a comparator. For example, as shown in FIG. 1, comparator 110 generates a trigger signal when an input signal exceeds a threshold voltage level.

However, input signals may not be single-ended as shown in FIG. 1, but instead may be differential. A differential signal is expressed as the difference between two complementary single-ended signals, each single-ended signal being referred to as one "side" of the differential signal. A conventional edge trigger circuit cannot trigger on a differential input signal because it only has one terminal for receiving an input signal, not two.

One solution to this problem is to apply only one side of the differential input signal to comparator 110, the rationale being that the one side is a single-ended version of the differential input signal having one half of the signal amplitude. However, this may result in inaccurate triggering when the differential input signal is not perfectly balanced. For example, suppose that the two sides of a differential input signal contain "common mode" noise, that is, noise which is present equally on both sides and thus not present in the difference signal because it is subtracted away. If only one side is applied to comparator 110 and comparator 110 generates a trigger signal in response to the common-mode noise, then that trigger signal is inaccurate because it reflects a characteristic not present in the differential input signal.

Another solution is to first convert the differential input signal into a single-ended signal and then apply that single-ended signal to comparator 110. This approach avoids the inaccurate triggering described above, however it only works for relatively low frequency input signals because all known methods of converting differential signals into single-ended signals either limit bandwidth or require a custom ASIC. For example, one such conversion method uses an op amp, however only relatively low bandwidth op amps are available such as the AD8000 available from Analog Devices, Inc. of Norwood, Mass. which has a −3 dB bandwidth of 1.5 GHz, much lower than the bandwidth of a comparator such as the 25706CP available from InPhi Corporation of Westlake Village, Calif. which has an operating bandwidth of 25 GHz. Furthermore, op amps inject noise onto the input signal which results in trigger jitter.

Yet another solution is to use two comparators to separately compare each side of the differential input signal to the threshold voltage level, and then combine the output signals of the two comparators to form the trigger signal. This approach avoids a differential-to-single-ended conversion, however the two output signals may transition at different times when the differential input signal is not perfectly balanced or when the threshold voltage level is set to other than the mid-point of the signals, and thus the combined trigger signal may have a piecewise transition which is unsuitable for triggering test and measurement instruments.

What is desired is trigger circuit capable of generating a trigger signal from a differential signal that operates at high bandwidth and with low jitter.

SUMMARY OF THE INVENTION

Accordingly, the present invention provides a trigger circuit for generating a trigger signal from a differential input signal. A first side of the differential input signal is applied to a first terminal of a first load termination resistor. A second side of the differential signal is applied to a first terminal of a second load termination resistor. A first side of a differential threshold voltage level is applied to a second terminal of the first load termination resistor. A second side of the differential threshold voltage level is applied to a second terminal of the second load termination resistor. A comparator generates the trigger signal when a voltage level at the first terminal of the first resistor exceeds a voltage level at the first terminal of the second resistor.

The objects, advantages and other novel features of the present invention are apparent from the following detailed description when read in conjunction with the appended claims and attached drawings.

DETAILED DESCRIPTION OF THE INVENTION

Figures 1, 2:
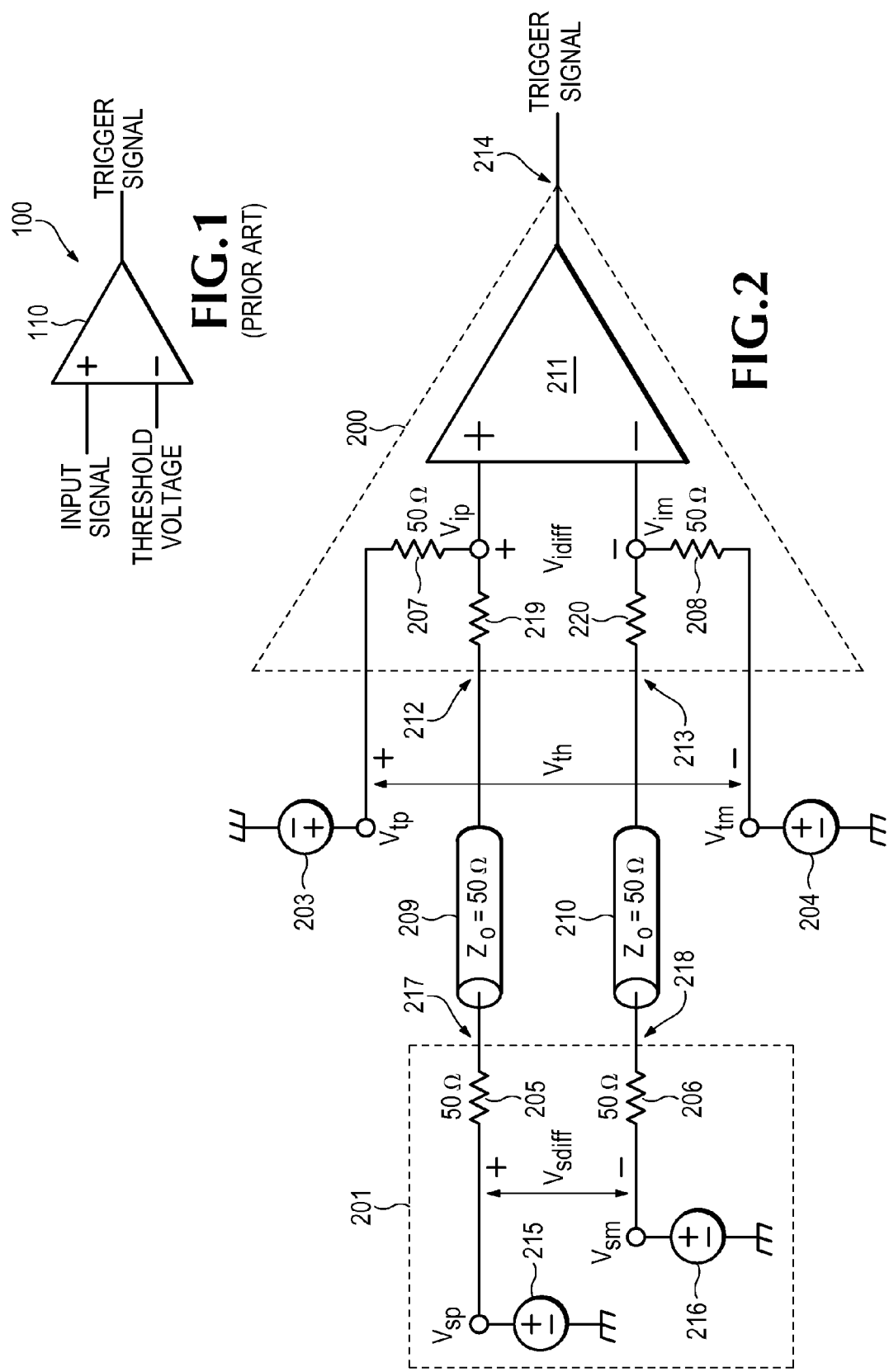
FIG. 1 depicts a simplified, schematic diagram of a conventional trigger circuit.
FIG. 2 depicts a simplified, schematic diagram of a trigger circuit according to the present invention.

Referring now to FIG. 2, a source-terminated differential signal source 201 transmits a differential input signal Vsdiff (which consists of nominally complementary single-ended signals Vsp and Vsm) via transmission lines 209 and 210 to a trigger circuit 200 according to the present invention. Transmission lines 209 and 210 represent interconnections having a 50 ohm characteristic impedance such as coaxial cables or traces on a circuit board. Trigger circuit 200 receives a differential threshold voltage level Vth (which consists of complementary single-ended signals Vtp and Vtm) from voltage sources 203 and 204.

Differential signal source 201 contains complementary voltage sources 215 and 216. An output of voltage source 215 is coupled through a 50 ohm source termination resistor 205 to a first output terminal 217 of differential signal source 201. Similarly, an output of voltage source 216 is coupled through a 50 ohm source termination resistor 206 to a second output terminal 218 of differential signal source 201.

A first input terminal 212 of trigger circuit 200 is coupled to a first terminal of an optional resistive attenuator 219. A second terminal of resistive attenuator 219 is coupled to a non-inverting input of a comparator 211 and to a first terminal of a 50 ohm load termination resistor 207. A second terminal of resistor 207 is coupled to an output of voltage source 203. Similarly, a second input terminal 213 of trigger circuit 200 is coupled to a first terminal of an optional resistive attenuator 220. A second terminal of resistive attenuator 220 is coupled to an inverting input of comparator 211 and to a first terminal of a 50 ohm load termination resistor 208. A second terminal of resistor 208 is coupled to an output of voltage source 204. An output of comparator 211 is coupled to an output 214 of trigger circuit 200.

The operation of trigger circuit 200, as depicted in FIG. 2, is described as follows:

Comparator 211 senses the difference Vidiff between the voltage level at its non-inverting input terminal Vip and the voltage level at its inverting input terminal Vim:

$$Vidiff = Vip - Vim \quad \text{Equation 1:}$$

Vip may be calculated as a linear superposition of Vsp and Vtp applied through a voltage-divider formed by resistors 205 and 207. Similarly, Vim may be calculated as a linear superposition of Vsm and Vtm applied through a voltage-divider formed by resistors 206 and 208:

$$Vip = 50\ \Omega/(50\ \Omega + 50\ \Omega)Vsp + 50\ \Omega/(50\ \Omega + 50\ \Omega)Vtp = \tfrac{1}{2}(Vsp + Vtp) \quad \text{Equation 2:}$$

$$Vim = 50\ \Omega/(50\ \Omega + 50\ \Omega)Vsm + 50\ \Omega/(50\ \Omega + 50\ \Omega)Vtm = \tfrac{1}{2}(Vsm + Vtm) \quad \text{Equation 3:}$$

Substituting Equations 2 and 3 into Equation 1 yields:

$$Vidiff = \tfrac{1}{2}(Vsp + Vtp) - \tfrac{1}{2}(Vsm + Vtm) \quad \text{Equation 4:}$$

Rearranging Equation 4 yields:

$$Vidiff = \tfrac{1}{2}(Vsp - Vsm) + \tfrac{1}{2}(Vtp - Vtm) \quad \text{Equation 5:}$$

Substituting Vth=Vtp−Vtm into Equation 5 yields:

$$Vidiff = \tfrac{1}{2}(Vsp - Vsm) + \tfrac{1}{2}Vth \quad \text{Equation 6:}$$

Substituting Vsdiff=Vsp−Vsm into Equation 6 and simplifying yields:

$$Vidiff = \tfrac{1}{2}(Vsdiff - Vth) \quad \text{Equation 7:}$$

Equation 7 reveals that comparator 211 directly senses the difference between the differential source voltage Vsdiff and the differential threshold voltage level Vth. Thus, comparator 211 directly generates the trigger signal when the differential input signal Vsdiff crosses the differential threshold voltage level Vth.

In some embodiments of the present invention, comparator 211 may be implemented using a packaged integrated circuit comparator such as the ADCMP572 available from Analog Devices, Inc. of Norwood, Mass. Such a comparator includes on-chip 50 ohm termination resistors coupled to its inverting and non-inverting input pins, the return paths of which are coupled to return pins. The manufacturer recommends that these return pins be coupled to ground via low-inductance paths or left open for high-impedance applications. However, in accordance with the present invention, threshold voltage levels Vtp and Vtm are applied to these return pins and the on-chip termination resistors are used to implement resistors 207 and 208.

Advantageously, trigger circuit 200 operates up to the operating bandwidth of comparator 211 because it avoids a differential-to-single-ended conversion. Also, trigger circuit 200 does not inject noise onto the differential input signal.

Differential signal source 201 must be source-terminated in order to provide the voltage-divider effect discussed above regarding Equations 2 and 3. Also, differential signal source 201 should be tolerant of current flowing backward into it from voltage sources 203 and 204. This reverse current flow may be reduced by the use of optional resistive attenuators 219 and 220. Resistive attenuators 219 and 220 may be simple resistors, as shown in FIG. 2. Alternatively, in order to properly terminate 50 ohm transmission lines 209 and 210 and avoid significant high frequency reflections, resistive attenuators 219 and 220 may be impedance matched attenuators, i.e., a pi or delta network of resistors. Alternatively, if transmission lines 209 and 210 have a characteristic impedance of 75 ohms instead of 50 ohms, then resistive attenuators 219 and 220 may be 25 ohm resistors.

During operation, the differential input signal Vsdiff forces current into and out of termination resistors 207 and 208. Accordingly, for the best operation threshold voltage level sources 203 and 204 should have a low output impedance, a flat frequency response, and be well decoupled.

In the embodiment described above, resistors 207 and 208 have resistance values of 50 ohms in order to match the characteristic impedance of transmission lines 209 and 210. If different resistance values are used, thereby producing different voltage-divider ratios, then the threshold voltage levels Vtp and Vtm should be adjusted in order to maintain the desired voltages Vip and Vim at the inputs of the comparator 211.

In the embodiment described above, the differential threshold voltage level Vth is applied evenly between voltage sources 203 and 204. Alternatively, Vth may be applied entirely by voltage source 203 or entirely by voltage source 204.

Although the present invention has particular application to oscilloscopes, it also has application to other types of test and measurement instruments such as logic analyzers and bit error rate testers. More generally, it may be used in any differential receiver application.

Thus, the present invention provides a high bandwidth, low-jitter trigger circuit which generates a trigger signal when a differential input signal crosses a differential threshold voltage level.

What is claimed is:

1. A trigger circuit comprising:
    a first trigger input terminal, a second trigger input terminal, and a trigger output terminal;
    a first voltage source having an output terminal, said first voltage source producing a first side of a differential threshold voltage level at said output terminal of said first voltage source;
    a second voltage source having an output terminal, said second voltage source producing a second side of said differential threshold voltage level at said output terminal of said second voltage source;
    a first termination resistor having a first terminal and a second terminal, said first terminal being coupled to said first trigger input terminal and said second terminal being coupled to said output terminal of said first voltage source;
    a second termination resistor having a first terminal and a second terminal, said first terminal being coupled to said second trigger input terminal and said second terminal being coupled to said output terminal of said second voltage source; and
    a comparator having an inverting input terminal, a non-inverting input terminal, and an output terminal, said non-inverting input terminal being coupled to said first trigger input terminal, said inverting input terminal being coupled to said second trigger input terminal, and said output terminal being coupled to said trigger output terminal.

2. The trigger circuit as recited in claim 1 further comprising:
    a first resistive attenuator coupled in series between said first trigger input terminal and said first terminal of said first resistor; and
    a second resistive attenuator coupled in series between said second trigger input terminal and said first terminal of said second resistor.

3. The trigger circuit as recited in claim 1 wherein:
said comparator comprises a packaged integrated circuit comparator; and
said first and second termination resistors comprise on-chip termination resistors.

4. A method of generating a trigger signal from a differential signal comprising the steps of:
applying a first side of said differential signal to a first terminal of a first termination resistor;
applying a second side of said differential signal to a first terminal of a second termination resistor;
applying a first side of a differential threshold voltage level to a second terminal of said first termination resistor;
applying a second side of said differential threshold voltage level to a second terminal of said second termination resistor; and
generating said trigger signal when a voltage level at said first terminal of said first termination resistor exceeds a voltage level at said first terminal of said second termination resistor.

* * * * *